United States Patent
Ponce et al.

(10) Patent No.: US 10,601,421 B1
(45) Date of Patent: Mar. 24, 2020

(54) MOSFET BASED ISOLATION CIRCUIT

(71) Applicant: Ademco Inc., Golden Valley, MN (US)

(72) Inventors: Jesus Omar Ponce, Chihuahua (MX); Luis Carlos Murillo, Chihauhua (MX); Cesar Alejandro Arzate, Chihuahua (MX); Eduardo Saenz Balderrama, Chihuahua (MX)

(73) Assignee: Ademco Inc., Golden Valley, MN (US)

( * ) Notice: Subject to any disclaimer, the term of this patent is extended or adjusted under 35 U.S.C. 154(b) by 0 days.

(21) Appl. No.: 16/557,201

(22) Filed: Aug. 30, 2019

(51) Int. Cl.
 *H03K 19/0175* (2006.01)
 *F24F 11/88* (2018.01)

(52) U.S. Cl.
 CPC ...... *H03K 19/017554* (2013.01); *F24F 11/88* (2018.01); *H03K 19/0175* (2013.01); *H03K 19/017518* (2013.01)

(58) Field of Classification Search
 CPC ... H03K 19/017554; H03K 19/017518; H03K 19/0175; H03K 19/003; F24F 11/88
 See application file for complete search history.

(56) References Cited

U.S. PATENT DOCUMENTS

| | | | |
|---|---|---|---|
| 7,271,990 B2 | 9/2007 | Bryan | |
| 7,408,751 B1* | 8/2008 | Lien | H02H 9/046 361/56 |
| 9,559,680 B2 | 1/2017 | Rakes | |
| 2012/0327544 A1* | 12/2012 | Peng | H02H 3/20 361/91.5 |
| 2013/0285471 A1 | 10/2013 | Ren et al. | |

* cited by examiner

*Primary Examiner* — Daniel D Chang
(74) *Attorney, Agent, or Firm* — Shumaker & Sieffert, P.A.

(57) ABSTRACT

A circuit to isolate a first circuit node from second circuit node at certain times yet connect the first circuit node and second circuit node at other times. For example, the isolation circuit may isolate a reference node from a system ground during certain phases of operation, but temporarily connect the reference node to the system ground during other phases. An isolation circuit of this disclosure may include a pair of MOSFETs in a back-to-back connection. The MOSFETs may be placed between the two nodes to be isolated. The MOSFETS may be driven by a bipolar junction transistor (BJT). A control signal applied to the BJT emitter controls the operation of the pair of MOSFETs. The isolation or connection from the power supply reference node to system ground may be controlled by applying a HIGH or LOW logic signal to the PNP transistor emitter.

20 Claims, 4 Drawing Sheets

US 10,601,421 B1

MOSFET BASED ISOLATION CIRCUIT

TECHNICAL FIELD

This disclosure relates to isolation circuits.

BACKGROUND

Some electrical circuits require certain circuit nodes to be isolated from other circuit nodes. Some examples techniques to implement isolation include opto-couplers, galvanic isolation, and diodes or other semiconductors and in the case of a direct current (DC) circuit, a capacitor may be used.

SUMMARY

In general, the disclosure describes techniques to isolate a first circuit node from a second circuit node at certain times, yet connect the first circuit node and the second circuit node at other times. For example, isolating a power supply reference node for a circuit from a system ground may be desirable during certain phases of operation, yet in other phases of operation, the power supply reference node may need to be temporarily connected to the system ground. An isolation circuit described by this disclosure includes a pair of N-channel metal oxide semiconductor field effect transistors (MOSFETs) in a back-to-back connection. The MOSFETs may be placed between a first node, such as a power supply reference and a second node, such as the system ground. The N-channel MOSFETS may be driven by a PNP bipolar junction transistor (BJT). A control signal applied to the BJT emitter controls the operation of the pair of MOSFETs. In this manner, the isolation or connection from the power supply reference node to system ground may be controlled by applying a HIGH or LOW logic signal to the PNP transistor emitter.

In one example, the disclosure is directed to circuit comprising: a bipolar junction transistor (BJT) configured to receive a control signal at an emitter terminal of the BJT; a first metal oxide semiconductor field effect transistor (MOSFET); a second MOSFET, wherein a gate of the first MOSFET is electrically connected to both a gate of the second MOSFET and to a collector terminal of the BJT; a voltage node electrically connected to a drain terminal of the first MOSFET; and a system ground coupled to a base of the BJT;

wherein the circuit is configured to: in response to receiving a first logic level from the control signal at the emitter terminal of the BJT, isolate the voltage node from the system ground; in response to receiving a second logic level from the control signal at the emitter terminal of the BJT, connect the voltage node to the system ground and allow current to flow through the first MOSFET and the second MOSFET to the voltage node.

In another example, the disclosure is directed to a system comprising: a system ground; a first isolation circuit comprising: a first bipolar junction transistor (BJT), wherein a base of the first BJT is coupled to the system ground; a first metal oxide semiconductor field effect transistor (MOSFET); a second MOSFET, wherein a gate of the first MOSFET is electrically connected to both a gate of the second MOSFET and to a collector terminal of the first BJT; a first voltage node electrically connected to a drain terminal of the first MOSFET; and a second isolation circuit comprising: a second BJT, wherein a base of the second BJT is coupled to the system ground; a third MOSFET; a fourth MOSFET, wherein a gate of the third MOSFET is electrically connected to both a gate of the fourth MOSFET and to a collector terminal of the second BJT; a second voltage node is electrically connected to a drain terminal of the third MOSFET; and processing circuitry configured to: control the first BJT via a first control signal line electrically connected to an emitter terminal of the first BJT; and control the second BJT via a second control signal line electrically connected to an emitter terminal of the second BJT.

In another example, the disclosure is directed to a method comprising: sending, by processing circuitry, a first control signal comprising a LOW logic level to a first isolation circuit, wherein the first isolation circuit comprises a first bipolar junction transistor (BJT) and wherein the processing circuitry sends the first control signal to an emitter of the first BJT; in response to the processing circuitry sending the LOW logic level, isolating, by the first isolation circuit, a first voltage node from a system ground; sending, by the processing circuitry, a second control signal comprising a HIGH logic level to a second isolation circuit, wherein the second isolation circuit comprises a second BJT and wherein the processing circuitry sends the second control signal to an emitter of the second BJT; in response to the processing circuitry sending the HIGH logic level, connecting, by the second isolation circuit, a second voltage node to the system ground, sending, by the processing circuitry, the HIGH logic level to the first isolation circuit at a first time; sending, by the processing circuitry, the HIGH logic level to the second isolation circuit at a second time different than the first time.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes techniques to isolate a first circuit node from a second circuit node at certain times, yet connect the first circuit node and the second circuit node at other times. For example, isolating a power supply reference node for a circuit from a system ground may be desirable during certain phases of operation, yet in other phases of operation, the power supply reference node may need to be temporarily connected to the system ground. An isolation circuit described by this disclosure includes a pair of N-channel metal oxide semiconductor field effect transistors (MOSFETs) in a back-to-back connection. The MOSFETs may be placed between a first node, such as a power supply reference and a second node, such as the system ground. The N-channel MOSFETS may be driven by a PNP bipolar junction transistor (BJT). A control signal applied to the BJT emitter controls the operation of the pair of MOSFETs. In this manner, the isolation or connection from the power supply reference node to system ground may be controlled by applying a HIGH or LOW logic signal to the PNP transistor emitter.

Figure 1:
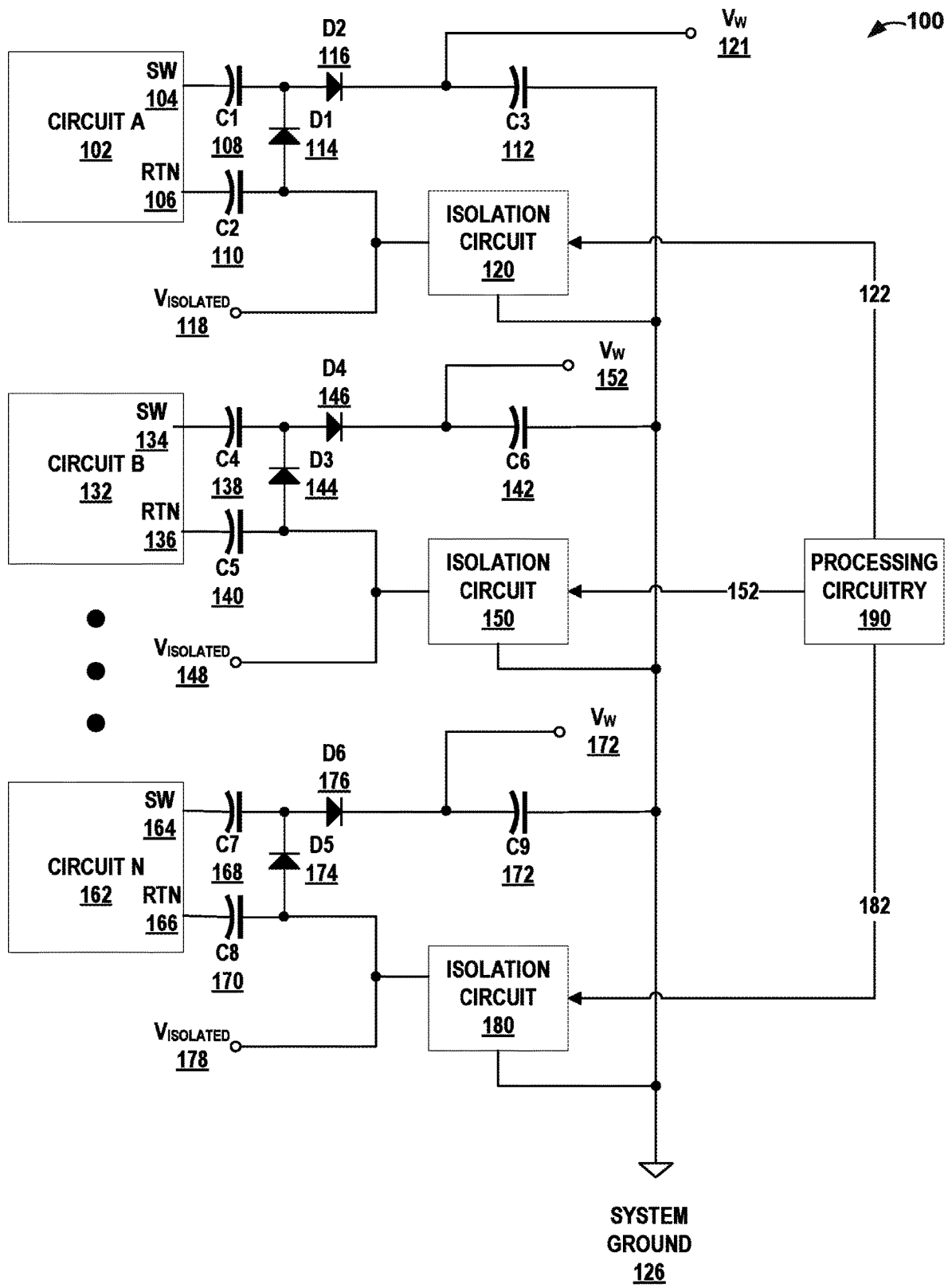
FIG. 1 is a block diagram illustrating a system configured to selectively isolate a power supply reference terminal of two or more circuits from system ground, while allowing at least one of the circuit reference terminals to connect to system ground.

FIG. 1 is a block diagram illustrating a system configured to selectively isolate a power supply reference terminal of two or more circuits from system ground, while allowing at least one of the circuit reference terminals to connect to system ground. System 100 includes N stages, depicted as circuits A (102) through N (162). In other examples the stages of system 100 may be implemented as separate systems or other types of circuits.

System 100 includes circuit A 102, circuit B 132 and circuit N 162. Each stage includes a reference terminal, RTN 106, RTN 136 and RTN 166, respectively. During operation, the reference terminal for each respective stage is momentarily connected to a common reference, system ground 126, through a respective isolation circuit 120, 150 or 180. Processing circuitry 130 is configured to drive a respective control signal 122, 152 or 182 for each isolation circuit 120, 150 or 180. The control signals from processing circuitry 130 determine which stage will be connected to the system ground 126 at a given time and which stages will be isolated from system ground 126.

In the example of system 100, the reference terminal, RTN 106 of circuit A 102 connects to isolation circuit 120 through capacitor C2 110. The node between capacitor C2 110 and isolation circuit 120 is Visolated 118. Visolated 118 connects to the anode of diode D1 114. The cathode of D1 114 connects to the anode of diode D2 116 and to terminal SW 104 of circuit A 102 through capacitor C1 108. The cathode of D2 116 connects to system ground 126 through capacitor C3 112. In the example of system 100, capacitor C3 112 is depicted as a single capacitor. However, in some examples, capacitor C3 112 may be implement as multiple capacitors, for example, two or more capacitors in parallel. Capacitors C6 142 and C9 172 may be implemented in a similar manner. The node at the cathode of D2 116 is Vw 121. Isolation circuit 120 couples Visolated 118 to system ground 126 or isolates Visolated 118 from system ground based on control signal 122 from processing circuitry 190.

Reference terminal, RTN 136 of circuit A 132 connects to isolation circuit 150 through capacitor C5 140. The node between capacitor C5 140 and isolation circuit 150 is Visolated 148. Visolated 148 connects to the anode of diode D3 144. The cathode of D3 144 connects to the anode of diode D4 146 and to terminal SW 134 of circuit A 132 through capacitor C4 138. The cathode of D4 146 connects to system ground 126 through capacitor C6 142. The node at the cathode of D42 116 is Vw 121. Isolation circuit 150 couples Visolated 148 to system ground 126 or isolates Visolated 148 from system ground based on control signal 152 from processing circuitry 190.

Reference terminal, RTN 166 of circuit A 162 connects to isolation circuit 180 through capacitor C8 170. The node between capacitor C8 170 and isolation circuit 180 is Visolated 178. Visolated 178 connects to the anode of diode D5 174. The cathode of D5 174 connects to the anode of diode D6 176 and to terminal SW 164 of circuit A 162 through capacitor C7 168. The cathode of D6 176 connects to system ground 126 through capacitor C9 172. Isolation circuit 180 couples Visolated 178 to system ground 126 or isolates Visolated 178 from system ground based on control signal 182 from processing circuitry 190.

In operation, each isolated stage configuration with an isolated reference node, e.g. Visolated 118, receives a control signal referenced to system ground 126, e.g. control signal 122, 152 or 182. The control signals from processing circuitry 190 drives the entire system such that each isolation circuit, e.g. isolation circuit 120, 150 or 180, so that the reference terminals, e.g. RTN 106, RTN 136 and RTN 166 are momentarily coupled to a common ground or separated grounds.

The techniques of this disclosure may have advantages over other techniques that may be used to temporarily connect and isolate a circuit from a reference voltage. For example, including a rectifier diode between a stage reference terminal, e.g. RTN 106, and system ground 126. In some examples, a rectifier diode may be included between Visolated 118 and system ground 126. A rectifier diode may provide good relative isolation, have a low cost and consume only a small area on an IC or circuit board. However, in an example in which a stage, such as circuit A 102 includes a MOSFET with a freewheeling diode, the rectifier diode may become part of a secondary current path through the freewheeling diode. Also, in some examples, the rectifier diode may limit current flow and a rectifier diode does not provide galvanic isolation.

Other technique may include to connect the RTN and SW terminal from each stage to an isolation (1:1) transformer and rectifying the output at transformer's secondary side to create a DC-DC converter. Such a transformer arrangement may provide a high isolation level, i.e. galvanic isolation between the reference voltage, such as system ground 126, and a capacitively coupled RTN terminal. However, such a transformer arrangement may require a custom transformer, which may be more expensive than other techniques. Also, a transformer may consume a large amount of circuit board space, compared to other options. Large PCB space is required. Additional circuitry may also be needed to connect and disconnect the transformer while turning on/off each stage based on operating conditions.

In contrast to other isolation techniques, the isolation techniques of this disclosure use semiconductor devices in a MOSFET array, e.g. M1 324 and M2 326, which isolates two signals. The driver portion of the isolation circuit uses a specific and special connection of a control signal to the emitter of a BJT to create a HIGH side driving circuit that turns off or turns on the MOSFET array with different control signals.

Figure 2:
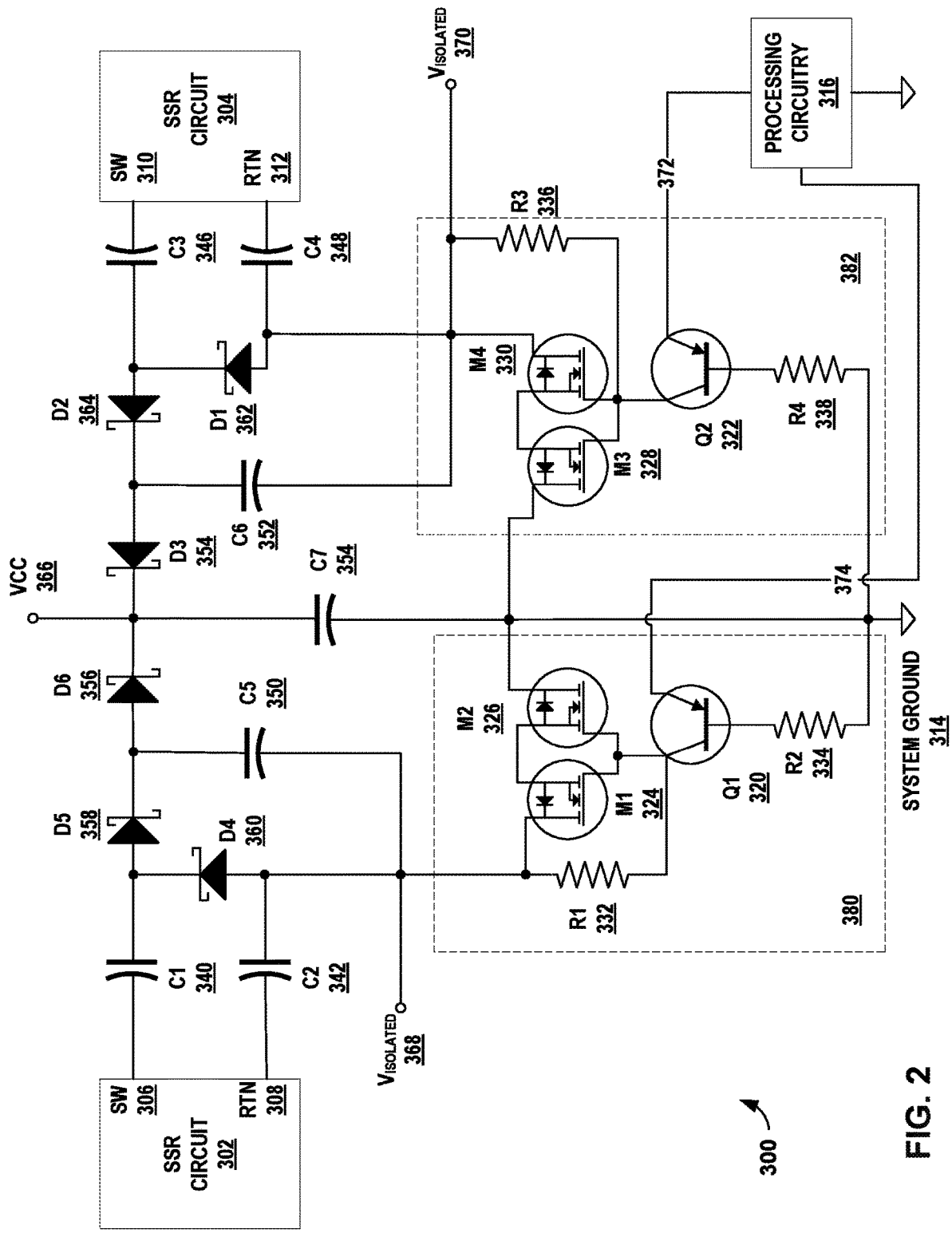
FIG. 2 is a schematic diagram illustrating two isolation circuits used to selectively isolate the power supply reference terminals of two separate circuits from the system ground.

FIG. 2 is a schematic diagram illustrating two isolation circuits used to selectively isolate the power supply reference terminals of two separate circuits from the system ground. The example of system 300 includes two stages, depicted by solid-state relay (SSR) circuit 302 and SSR circuit 304 connected to system ground 314 through isolation circuits 380 and 382 respectively. System 300 is an example of system 100 described above in relation to FIG. 1.

Similar to the stages of system 100, described above in relation to FIG. 1, reference terminal, RTN 308 of SSR circuit 302 connects to isolation circuit 380 through capacitor C2 342. The node between capacitor C2 342 and isolation circuit 380 is Visolated 368. Visolated 368 connects to the anode of diode D4 360. The cathode of D4 360 connects to the anode of diode D5 358 and to terminal SW 306 of SSR circuit 302 through capacitor C1 340. The cathode of D5 358 connects to the anode of diode D6 356. The cathode of D6 356 connects to system ground 314 through capacitor C7 354 and connects to the cathode of diode D3 354. Similar to the example of system 100, capacitor C7 354 is depicted as a single capacitor. However, in some examples, capacitor C7 354 may be implement as multiple capacitors, for example, two or more capacitors in parallel.

In the example of system 300, isolated node Visolated 368 connects to the drain of low-side transistor M1 324. Isolation circuit 380 includes resistor R1 332 coupled between Visolated 368 and both gates of transistors M1 324 and M2 326. In the example of FIG. 2, transistors M1 324 and M2 326 are depletion mode n-channel MOSFETs. The gates of transistors M1 324 and M2 326 are also connected to the collector of BJT Q1 320. The base of BJT Q1 320 connects to system ground through resistor R2 334. The emitter of BJT Q1 320 receives control signal 374 from processing circuitry 316. The impedance value of resistor R2 334, along with the value of resistor R1 332 may be selected to determine the current consumption of the circuit comprising SSR circuit 302 and isolation circuit 380. The value of a resistor may be referred to as a resistance value, a magnitude of impedance, or impedance value in this disclosure.

The source of transistor M2 326 connects to the source of transistor M1 324. The drain of transistor M2 326 connects directly to system ground 314. The arrangement of transistors M2 326 and M1 324 may be considered a back-to-back MOSFET array.

In operation, and similar to isolation circuit 120 described above in relation to FIG. 1, isolation circuit 380 couples Visolated 368 to system ground 314 or isolates Visolated 368 from system ground 314 based on control signal 374 from processing circuitry 316.

Similar to SSR circuit 302, reference terminal, RTN 312 of SSR circuit 304 connects to isolation circuit 382 through capacitor C4 348. The node between capacitor C4 348 and isolation circuit 382 is Visolated 370. Visolated 370 connects to the anode of diode D1 362. The cathode of D1 362 connects to the anode of diode D2 364 and to terminal SW 310 of SSR circuit 304 through capacitor C3 346. The cathode of D2 364 connects to the anode of diode D3 354. The cathode of D3 354 connects to system ground 314 through capacitor C7 354 and connects to the cathode of diode D6 356.

In the example of system 300, isolated node Visolated 370 connects to the drain of low-side transistor M4 330. Isolation circuit 382 includes resistor R3 336 coupled between Visolated 370 and both gates of transistors M4 330 and M3 328. In the example of FIG. 2, transistors M4 330 and M3 328 are also depletion mode n-channel MOSFETs. The gates of transistors M4 330 and M3 328 are also connected to the collector of BJT Q2 322. The base of BJT Q2 322 connects to system ground through resistor R4 338. The emitter of BJT Q2 322 receives control signal 372 from processing circuitry 316. Similar to R1 332 and R2 334, the impedance value of resistor R4 334, along with the value of resistor R3 336 may be selected to determine the current consumption of the circuit comprising SSR circuit 304 and isolation circuit 382.

The source of transistor M3 328 connects to the source of transistor M4 330. The drain of transistor M3 328 connects directly to system ground 314. As with M1 324 and M2 326, the arrangement of transistors M2 326 and M1 324 may be considered a back-to-back MOSFET array. In operation, isolation circuit 382 couples Visolated 370 to system ground 314 or isolates Visolated 370 from system ground 314 based on control signal 372 from processing circuitry 316.

Described another way, the back-to-back MOSFET array (324 and 326 or 328 and 330) isolates system ground 314 from isolated nodes Visolated 368 and Visolated 370. To ensure the back-to-back MOSFET arrays are off when control signal 372 or control signal 374 is not present, a resistor (332, 336) connects from gate to the drain of the low-side transistors (M1 324 and M4 330). To drive ON and OFF each MOSFET array, a BJT (Q1 320, Q2 322) has been included with a specific configuration. Instead of driving the base of the BJT, processing circuitry 316 inserts the control signal (372 or 374) to the emitter of the BJT (Q1 320, Q2 322).

Each control signal (372, 374) is referenced to system ground 314 within processing circuitry 316, and the base of each BJT is connected to system ground 314. In this manner, a LOW control signal (372, 374) from processing circuitry 316 prevents the respective BJT (Q1 320 or Q2 322) from entering into conduction mode, which would cause the respective MOSFET array to be off. Similarly, a HIGH control signal (372, 374) to the emitter of the respective BJT (Q1 320 or Q2 322) polarizes the emitter-base junction and the BJT enters in conduction mode, thus causing the respective MOSFET array coupled to the BJT to be ON. For example, current through BJT Q1 320 causes current to flow through R1 332 causing a gate-drain voltage for M1 324 as well as for M2 326. Similarly for the MOSFET array comprising M3 328 and M4 330, current through BJT Q2 322 causes current to flow through R2 336 controlling a gate-drain voltage for M3 328 as well as for M4 330.

When a respective MOSFET array is OFF, the respective isolated node (Visolated 368 or Visolated 370) and system ground 314 are at different potential, thus they are "isolated". When MOSFET array is ON, isolated node (Visolated 368 or Visolated 370) and system ground 314 are at the same potential, i.e. coupled via the respective back-to-back MOSFET array.

In other words, a HIGH logic level (referenced to system ground 314) from the control signal (372 or 374) at the emitter of the respective BJT (Q1 320 or Q2 322), connects the respective voltage node (Visolated 368 or Visolated 370) to the system ground 314 and allows current to flow through the respective MOSFET array to the respective voltage node. The current may be considered a rectified direct current (DC) or pulsating current.

In some examples, processing circuitry 316 may be configured to only connect one of the respective power supply reference terminals to system ground while the other power supply reference terminal is held isolated. For example, processing circuitry 316 may cause control signal 374 to pass a HIGH logic level to the base of BJT Q1 320, which will couple RTN 308 of SSR circuit 302 to system ground 314 via the respective back-to-back MOSFET array (M1 324 and M2 326). Processing circuitry 316 may be configured to output a LOW logic level to BJT Q2 322 via control signal 372 to isolate Visolated 370, and thus RTN 312, from system ground 314 whenever control signal 374 outputs a HIGH logic level to BJT Q1 320. Similarly for the opposite configuration, i.e. processing circuitry 316 may be configured to output a LOW logic level to BJT Q1 320 via control signal 374 to isolate Visolated 368, and thus RTN 308, from system ground 314 whenever control signal 372 outputs a HIGH logic level to BJT Q2 322. However, in other examples, depending on the nature of the stages coupled to isolation circuits 380 and 382, processing circuitry 316 may be configured to cause one or more stages to be coupled to system ground 314 simultaneously.

Figure 3:
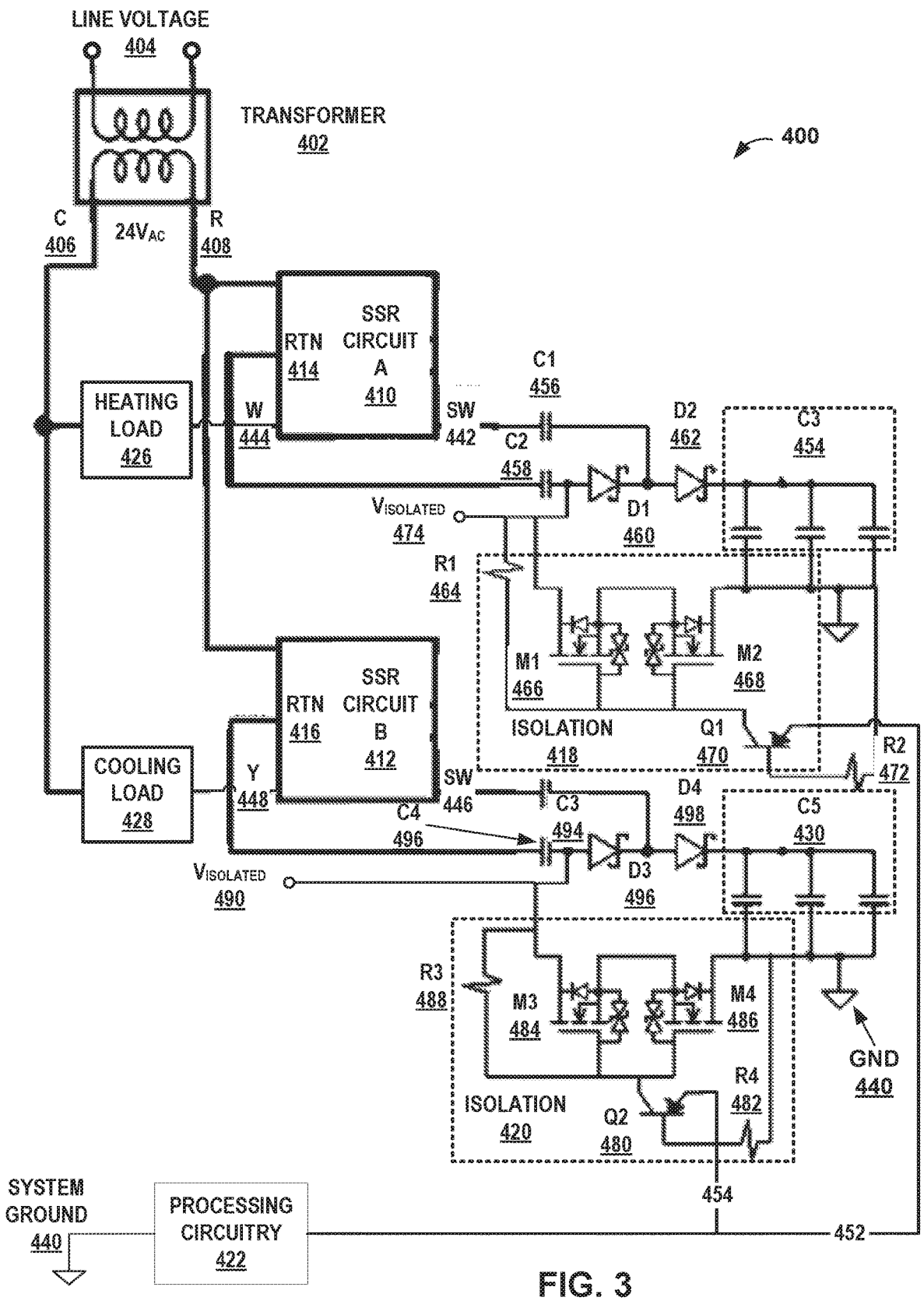
FIG. 3 is a schematic diagram illustrating an example application of the isolation circuit of this disclosure to an HVAC system.

FIG. 3 is a schematic diagram illustrating an example application of the isolation circuit of this disclosure to a heating, ventilation, and air conditioning system (HVAC) system. One application of the techniques of this disclosure may include adding the isolation circuitry to one or more SSRs that are part of a power stealing thermostat for an HVAC system. Power stealing refers to an arrangement of circuit elements so that a circuit may "steal" a small amount of current from an unused circuit path in the thermostat. For example, when the system is idle a small amount of power may be taken from each of a heating control circuit path and a cooling control circuit path. That is, when in heat mode the power may be taken from the "call for cooling path," e.g. the Y1 terminal. When in cooling mode the power may be taken from the "call for heat path, e.g. the W1 terminal. In this example, power stealing may not work in a heat only or cool only installation because when the system calls for heat there is no cool path to steal power from. Thus, a power source in the thermostat, such as a battery may deplete faster. Similarly, in a cool-only system there is no call for heat circuit path so the system again may be unable steal power. Table 1 below list some examples of HVAC signals:

TABLE 1

HVAC Signals

| Signal ID | Wire Color Code | Description |
|---|---|---|
| R | Red | Power, 24 Vac transformer |
| Rc | Red | Power - cooling, 24 Vac transformer |
| Rh | Red | Power - heat, 24 Vac transformer |
| C | Black/Blue | Common of 24 Vac transformer |
| W or W1 | White | Primary heat cell relay |
| E | Brown | Emergency heat relay |
| Y or Y1 | Yellow | Primary cool call relay |
| Y2 | Yellow | Secondary cool call relay |
| G | Green | Fan relay |

In the example of HVAC system 400, a first stage, SSR circuit A 410, receives AC power via the R connection 408. R connection 408 receives 24 VAC power via transformer 402, which is coupled to line voltage 404. The power supply reference connection RTN 414 of SSR circuit A 410 is configured to be momentarily connected to system ground 440 through isolation circuit 418 when the logic level of control signal 452 is HIGH. RTN 414 is configured to be connected to system ground 440 during power stealing, based on control signal 452 from processing circuitry 422. In example of FIG. 3, SSR circuit A 410 is configured to control the heating load 426 of HVAC system 400 via the W connection 444 to heating load 426. Heating load 426 may also be coupled to the common, or C connection 406.

Similar to the stages of system 100, described above in relation to FIG. 1, reference terminal, RTN 414 of SSR circuit A 410 connects to isolation circuit 418 through capacitor C2 458. The node between capacitor C2 458 and isolation circuit 418 is an isolation node, Visolated 474. Visolated 474 connects to the anode of diode D1 460. The cathode of D1 460 connects to the anode of diode D2 462 and to terminal SW 442 of SSR circuit A 410 through capacitor C1 456. The cathode of D2 462 connects to system ground 440 through capacitor C3 454. As described above in relation to FIGS. 1 and 2, capacitor C3 454 is depicted as three capacitors in parallel.

Isolated node Visolated 474 connects to the drain of low-side transistor M1 466. Isolation circuit 418 includes resistor R1 464 coupled between Visolated 474 and both gates of transistors M1 466 and M2 468. In the example of FIG. 3, transistors M1 466 and M2 468 are depletion mode n-channel MOSFETs. The gates of transistors M1 466 and M2 468 are also connected to the collector of BJT Q1 470. The base of BJT Q1 470 connects to system ground through resistor R2 472. The emitter of BJT Q1 470 receives control signal 452 from processing circuitry 422. As described above in relation to FIG. 2, the value of resistor R2 472, along with the value of resistor R1 464 may determine the current consumption of the circuit. The source terminal of transistor M2 468 connects to the source terminal of transistor M1 466. The drain of transistor M2 468 connects to system ground.

In operation, as described above in relation to FIGS. 1 and 2, isolation circuit 418 couples Visolated 474 to system ground or isolates Visolated 474 from system ground based on the logic level of control signal 452 from processing circuitry 422.

The second stage, SSR circuit B 412, also receives AC power via the R connection 408. The power supply reference connection RTN 416 of SSR circuit B 412 is configured to be momentarily connected to system ground 440 through isolation circuit 420 when the logic level of control signal 454 is HIGH. Similar to SSR circuit A 410, RTN 416 is configured to be connected to system ground 440 during power stealing, based on control signal 454 from processing circuitry 422. In example of FIG. 3, SSR circuit B 412 is configured to control the cooling load 428 of HVAC system 400 via the Y connection 448 to cooling load 428. Cooling load 428 may also be coupled to the common, or C connection 406.

As with SSR circuit A 410 and isolation circuit 418, reference terminal, RTN 416 of SSR circuit B 412 connects to isolation circuit 420 through capacitor C4 496. The node between capacitor C4 496 and isolation circuit 420 is isolation node, Visolated 490. Visolated 490 connects to the anode of diode D3 496. The cathode of D3 496 connects to the anode of diode D4 498 and to terminal SW 446 of SSR circuit B 412 through capacitor C3 494. The cathode of D4 498 connects to system ground 440 through capacitor C5 430. As with capacitor C3 454, capacitor C5 430 is depicted as three capacitors in parallel.

Isolated node Visolated 490 connects to the drain of low-side transistor M3 484. Isolation circuit 420 includes resistor R1 488 coupled between Visolated 490 and both gates of transistors M3 484 and M4 486. The gates of transistors M3 484 and M4 486 are also connected to the collector of BJT Q2 480. The base of BJT Q2 480 connects to system ground through resistor R4 482. The emitter of BJT Q2 480 receives control signal 454 from processing circuitry 422. As described, the value of resistor R4 482, along with the value of resistor R3 488 may determine the current consumption of the circuit. The source of transistor M3 484 connects to the source of transistor M4 486. The drain of transistor M4 486 connects to system ground 440. In operation, isolation circuit 420 couples Visolated 490 to system ground during power stealing or isolates Visolated 490 from system ground based on the logic level of control signal 452 from processing circuitry 422.

Figure 4:
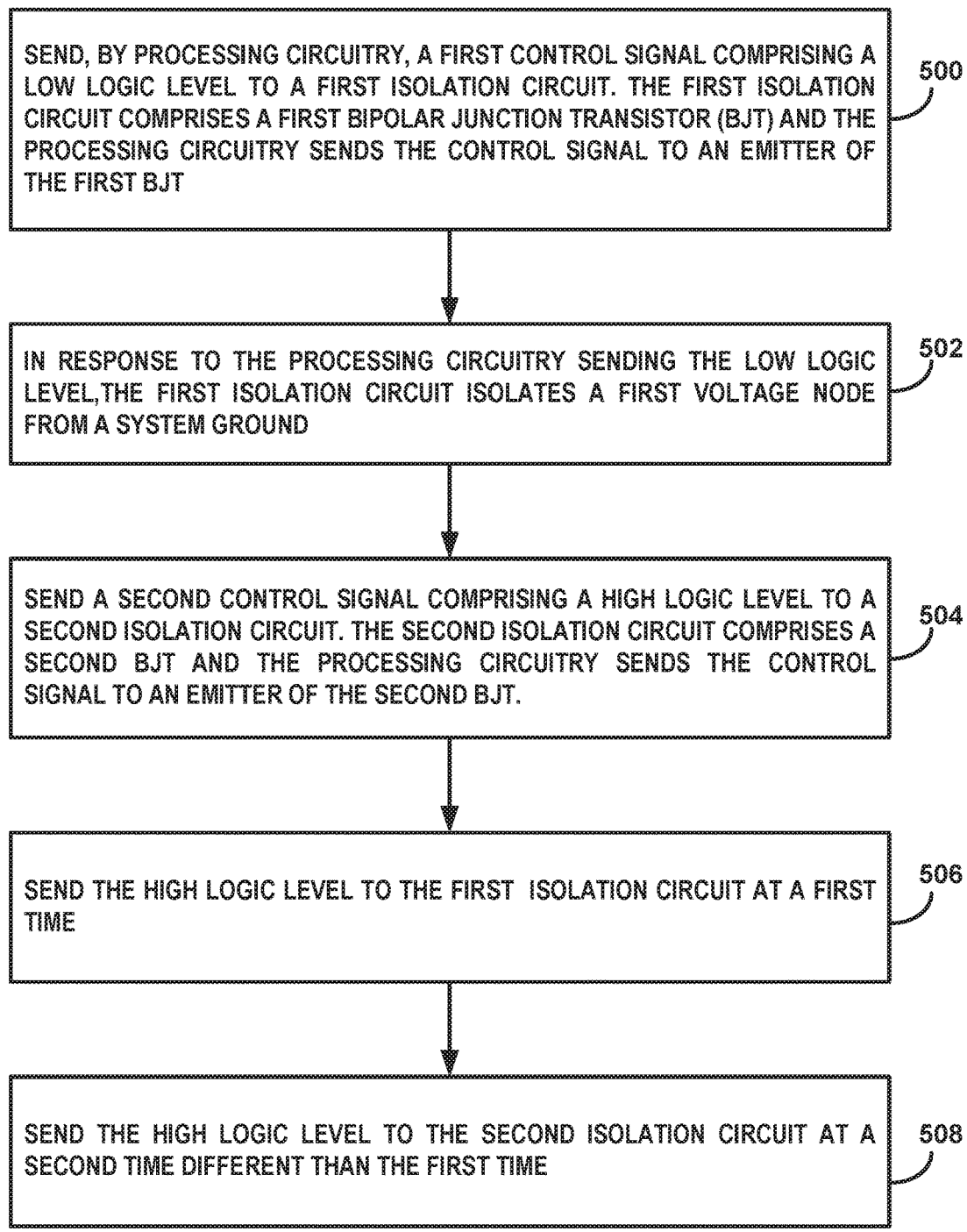
FIG. 4 is a flow chart illustrating an example operation of the isolation circuit of this disclosure.

FIG. 4 is a flow diagram illustrating an example mode operation of the isolation circuit of this disclosure. The blocks in FIG. 4 will be described in terms of FIG. 2, unless otherwise noted.

During a first time period, processing circuitry 316 may send a first control signal 374 comprising a LOW logic level to a first isolation circuit 380 (500). In the example of FIG. 2, isolation circuit 380 includes a first BJT Q1 320 with control signal 374 coupled to the emitter of BJT Q1 320.

As described above in relation to FIG. 2, because of the circuit arrangement of isolation circuit 380, in response to the processing circuitry sending the LOW logic level to the emitter of Q1 320 causes Q1 320 to prevent conduction through Q1 320. Therefore, there is insufficient voltage across R1 322 to turn on M1 324 and M2 326. In this manner isolation circuit 380 isolates voltage node Visolated 368 from system ground 314 (502).

Also during the first time period, processing circuitry 316 may send a second control signal 372 comprising a HIGH logic level to a second isolation circuit 382 (504). The second isolation circuit may include a second BJT Q2 382. Control signal 372 from processing circuitry 316 is coupled to the emitter of BJT Q2 322 (504).

As described above in relation to FIG. 2, the circuit arrangement of isolation circuit 382, with the base of Q2 382 coupled to system ground 314, causes isolation circuit 382 to connect voltage node Visolated 370 to system ground 314. As described above in relation to FIG. 2, the HIGH logic level of control signal 372 with respect to system ground 314 at the emitter of Q2 322 causes Q2 322 to conduct. As current flows through R3 336, a magnitude of drain-gate voltage for M4 330 and M3 328 becomes enough to turn ON transistors M4 330 and M3 328, which couples Visolated 370 to system ground 314 (506).

As described above in relation to FIG. 2, in some examples, processing circuitry is configured send the HIGH logic level to the second isolation circuit (508) at a different time than the processing circuitry sends a HIGH logic level to the first isolation circuit (506). In other examples, processing circuitry 316 may allow two or more stages of a system to simultaneously connect to system ground.

Various examples of the disclosure have been described. These and other examples are within the scope of the following claims.

The invention claimed is:

1. A circuit comprising:
a bipolar junction transistor (BJT) configured to receive a control signal at an emitter terminal of the BJT;
a first metal oxide semiconductor field effect transistor (MOSFET);
a second MOSFET, wherein a gate of the first MOSFET is electrically connected to both a gate of the second MOSFET and to a collector terminal of the BJT;
a voltage node electrically connected to a drain terminal of the first MOSFET; and
a system ground coupled to a base of the BJT;
wherein the circuit is configured to:
in response to receiving a first logic level from the control signal at the emitter terminal of the BJT, isolate the voltage node from the system ground;
in response to receiving a second logic level from the control signal at the emitter terminal of the BJT, connect the voltage node to the system ground and allow current to flow through the first MOSFET and the second MOSFET to the voltage node.

2. The circuit of claim 1, wherein a source terminal of the first MOSFET is electrically connected to a source terminal of the second MOSFET.

3. The circuit of claim 1, wherein the first logic level is a logic LOW and the second logic level is a logic HIGH.

4. The circuit of claim 1, wherein a current consumption of the circuit is a function of a magnitude of an impedance between the system ground and the base of the BJT.

5. The circuit of claim 4, wherein:
a magnitude of an impedance between the drain terminal of the first MOSFET and the gate of the first MOSFET provides a drain-gate voltage for the first MOSFET; and
a current consumption of the circuit is a function of:
the magnitude of the impedance between the system ground and the base of the BJT; and
the magnitude of the impedance between the drain terminal of the first MOSFET and the gate of the first MOSFET.

6. The circuit of claim 5, wherein the impedance between the system ground and the base of the BJT is provided by a first resistor and the impedance between the drain terminal of the first MOSFET and the gate of the first MOSFET is provided by a second resistor.

7. The circuit of claim 1, wherein the current allowed to flow through the first MOSFET and the second MOSFET is a rectified direct current (DC).

8. The circuit of claim 1, wherein a drain terminal of the second MOSFET is directly connected to the system ground.

9. A system comprising:
a system ground;
a first isolation circuit comprising:
a first bipolar junction transistor (BJT), wherein a base of the first BJT is coupled to the system ground;
a first metal oxide semiconductor field effect transistor (MOSFET);
a second MOSFET, wherein a gate of the first MOSFET is electrically connected to both a gate of the second MOSFET and to a collector terminal of the first BJT;
a first voltage node electrically connected to a drain terminal of the first MOSFET; and
a second isolation circuit comprising:
a second BJT, wherein a base of the second BJT is coupled to the system ground;
a third MOSFET;
a fourth MOSFET, wherein a gate of the third MOSFET is electrically connected to both a gate of the fourth MOSFET and to a collector terminal of the second BJT;
a second voltage node is electrically connected to a drain terminal of the third MOSFET; and
processing circuitry configured to:
control the first BJT via a first control signal line electrically connected to an emitter terminal of the first BJT; and
control the second BJT via a second control signal line electrically connected to an emitter terminal of the second BJT.

10. The system of claim 9, wherein the processing circuitry is configured to:
send a HIGH logic level via the first control signal line to the first BJT at the same time the processing circuitry sends a LOW logic level via the second control signal line to the second BJT; and
send a HIGH logic level via the second control signal line to the second BJT at a different time than the processing circuitry sends a HIGH logic level via the first control signal line to the first BJT.

11. The system of claim 10, wherein the first isolation circuit is configured to:
in response to the processing circuitry sending a LOW logic level via the first control signal line, isolate the first voltage node from the system ground; and
in response to the processing circuitry sending a HIGH logic level via the first control signal line, connect the first voltage node to the system ground and to allow current to flow through the first MOSFET and the second MOSFET to the first voltage node.

12. The system of claim 10, wherein the second isolation circuit is configured to:

in response to the processing circuitry sending a LOW logic level via the second control signal line, isolate the second voltage node from the system ground; and in response to the processing circuitry sending a HIGH logic level via the second control signal line, connect the second voltage node to the system ground and allow current to flow through the third MOSFET and the fourth MOSFET to the second voltage node.

13. The system of claim 9, wherein a current consumption of the first isolation circuit is a function of a magnitude of an impedance between the system ground and the base of the first BJT.

14. The system of claim 13, wherein:
a magnitude of an impedance between the drain terminal of the first MOSFET and the gate of the first MOSFET provides a drain-gate voltage for the first MOSFET; and
a current consumption of the first isolation circuit is a function of:
the magnitude of the impedance between the system ground and the base of the first BJT; and
the magnitude of the impedance between the drain terminal of the first MOSFET and the gate of the first MOSFET.

15. The system of claim 14, wherein the impedance between the system ground and the base of the first BJT is provided by a first resistor and the impedance between the drain terminal of the first MOSFET and the gate of the first MOSFET is provided by a second resistor.

16. The system of claim 9, wherein the drain terminal of the second MOSFET is directly connected to the system ground.

17. A method comprising:
sending, by processing circuitry, a first control signal comprising a LOW logic level to a first isolation circuit, wherein the first isolation circuit comprises a first bipolar junction transistor (BJT) and wherein the processing circuitry sends the first control signal to an emitter of the first BJT;

in response to the processing circuitry sending the LOW logic level, isolating, by the first isolation circuit, a first voltage node from a system ground;

sending, by the processing circuitry, a second control signal comprising a HIGH logic level to a second isolation circuit, wherein the second isolation circuit comprises a second BJT and wherein the processing circuitry sends the second control signal to an emitter of the second BJT;

in response to the processing circuitry sending the HIGH logic level, connecting, by the second isolation circuit, a second voltage node to the system ground, sending, by the processing circuitry, the HIGH logic level to the first isolation circuit at a first time;

sending, by the processing circuitry, the HIGH logic level to the second isolation circuit at a second time different than the first time.

18. The method of claim 17, further comprising:
in response to the processing circuitry sending the HIGH logic level to the second isolation circuit, controlling, by the second isolation circuit, a first metal oxide semiconductor field effect transistor (MOSFET) and a second MOSFET, to allow current to flow to the second node.

19. The method of claim 18, wherein a gate of the first MOSFET is electrically connected to both a gate of the second MOSFET and to a collector terminal of the second BJT.

20. The method of claim 18, wherein a drain terminal of the second MOSFET is directly connected to the system ground.

* * * * *